United States Patent
Yan

(10) Patent No.: US 10,491,184 B1
(45) Date of Patent: Nov. 26, 2019

(54) COMMON MODE FILTERS WITH INVERTED GROUND STRUCTURES

(71) Applicant: Amazon Technologies, Inc., Seattle, WA (US)

(72) Inventor: John Yan, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 124 days.

(21) Appl. No.: 15/782,552

(22) Filed: Oct. 12, 2017

(51) Int. Cl.
| | |
|---|---|
| *H03H 7/42* | (2006.01) |
| *H01P 1/203* | (2006.01) |
| *H03H 7/09* | (2006.01) |
| *H03H 7/32* | (2006.01) |
| *H03H 7/01* | (2006.01) |
| *H03H 1/00* | (2006.01) |

(52) U.S. Cl.
CPC ............. *H03H 7/427* (2013.01); *H01P 1/203* (2013.01); *H03H 7/0115* (2013.01); *H03H 7/09* (2013.01); *H03H 7/1716* (2013.01); *H03H 7/32* (2013.01); *H03H 2001/0085* (2013.01)

(58) Field of Classification Search
CPC .......... H03H 7/427; H03H 2001/0085; H03H 7/0115; H03H 7/09; H01P 3/08; H01P 1/203
USPC .......................... 333/4, 5, 12, 175, 181, 185
See application file for complete search history.

(56) References Cited

U.S. PATENT DOCUMENTS

| | | | |
|---|---|---|---|
| 8,253,509 B2 * | 8/2012 | Pai ..................... | H01P 1/20381 333/12 |
| 2007/0188265 A1 * | 8/2007 | Perreault ................ | H03H 7/427 333/181 |
| 2011/0032048 A1 * | 2/2011 | Wu ........................ | H01P 1/203 333/12 |
| 2016/0276999 A1 * | 9/2016 | Sim ..................... | H01F 27/2823 |

OTHER PUBLICATIONS

C. Cheng, et al., "A Compact Dual-Band Common-Mode Filtering Component for EMC in Wireless Communication", IEEE Asia-Pacific Symposium on Electromagnetic Compatibility, May 26-29, 2015, Teipei, Taiwan.

(Continued)

*Primary Examiner* — Rakesh B Patel

(74) *Attorney, Agent, or Firm* — Eversheds Sutherland (US) LLP

(57) ABSTRACT

Systems, methods, and computer-readable media are disclosed for common mode filters with inverted inductive ground structures. In one embodiment, an example printed circuit board may have a first layer with a pair of differential transmission lines, and a common mode filter embedded in the printed circuit board. The common mode filter may include a signal reference structure and an inductive ground structure. The signal reference structure may include a first rectangular portion, and a second rectangular portion having the same dimensions. The second rectangular portion may be separated from the first rectangular portion by a distance. The inductive ground structure may include a first cell having a first conductive line coupled to a first side of the first rectangular portion and a first edge of the common mode filter, and a second cell having a second conductive line coupled to a first side of the second rectangular portion and the first edge.

20 Claims, 9 Drawing Sheets

(56) References Cited

OTHER PUBLICATIONS

C. Oliveieri et al., "Miniaturization Approach for EBG-Based Common Mode Filter and Interface Analysis", IEEE Symposium on Electromagnetic Compatibility and Signal Integrity, Mar. 15-21, 2015, Santa Clara, CA.

M. Pajovic, "The Gigahertz Two-Band Common-Mode Filter for 10-Gbit/s Differential Signal Lines", IEEE Electromagnetic Compatibility Symposium, Aug. 5-9, 2013, Denver CO.

A. Ieong, "An Ultra Compact Common-Mode Filter for RF Interference Control in 3G Wireless Communication Systems", IEEE Electromagnetic Compatibility Symposium, Jul. 25-30, 2010, Ft. Lauderdale, FL.

F. Paulis, "EBG-Based Common-Mode Microstrip and Stripline Filters: Experimental Investigation of Performances and Crosstalk" IEEE Transactions on Electromagnetic Compatibility, vol. 57, No. 5, Oct. 2015, L'Aquila, Italy.

Product Description for Common Mode Choke Coils/Common Mode Noise Filters: "DLP11TB800UL2#", <http://www.murata.com/products/productdetail.aspx?cate=luNoiseSupprFilteChipCommoModeChokeCoil&partno=DLP11TB800UL2%23>, Accessed Nov. 7, 2017, Kyoto, Japan.

\* cited by examiner

COMMON MODE FILTERS WITH INVERTED GROUND STRUCTURES

BACKGROUND

Electronic devices may include a number of components, such as radios and transceivers, that may emit signals at different frequencies. For example, an electronic device may include components that transmit high speed differential signals and may also radiate emission and/or electromagnetic interference. Such emissions and/or interference may be detected by radios and other components of the device, and may interfere with device or component performance, for example, as a result of signal noise. In addition, as electronic devices become smaller, reduced distances between radios and other components may increase a likelihood of interference and/or corruption of signals between different components of the device. Accordingly, filters that can reduce interference while reducing or maintaining a device footprint may be desired.

Figure 1:
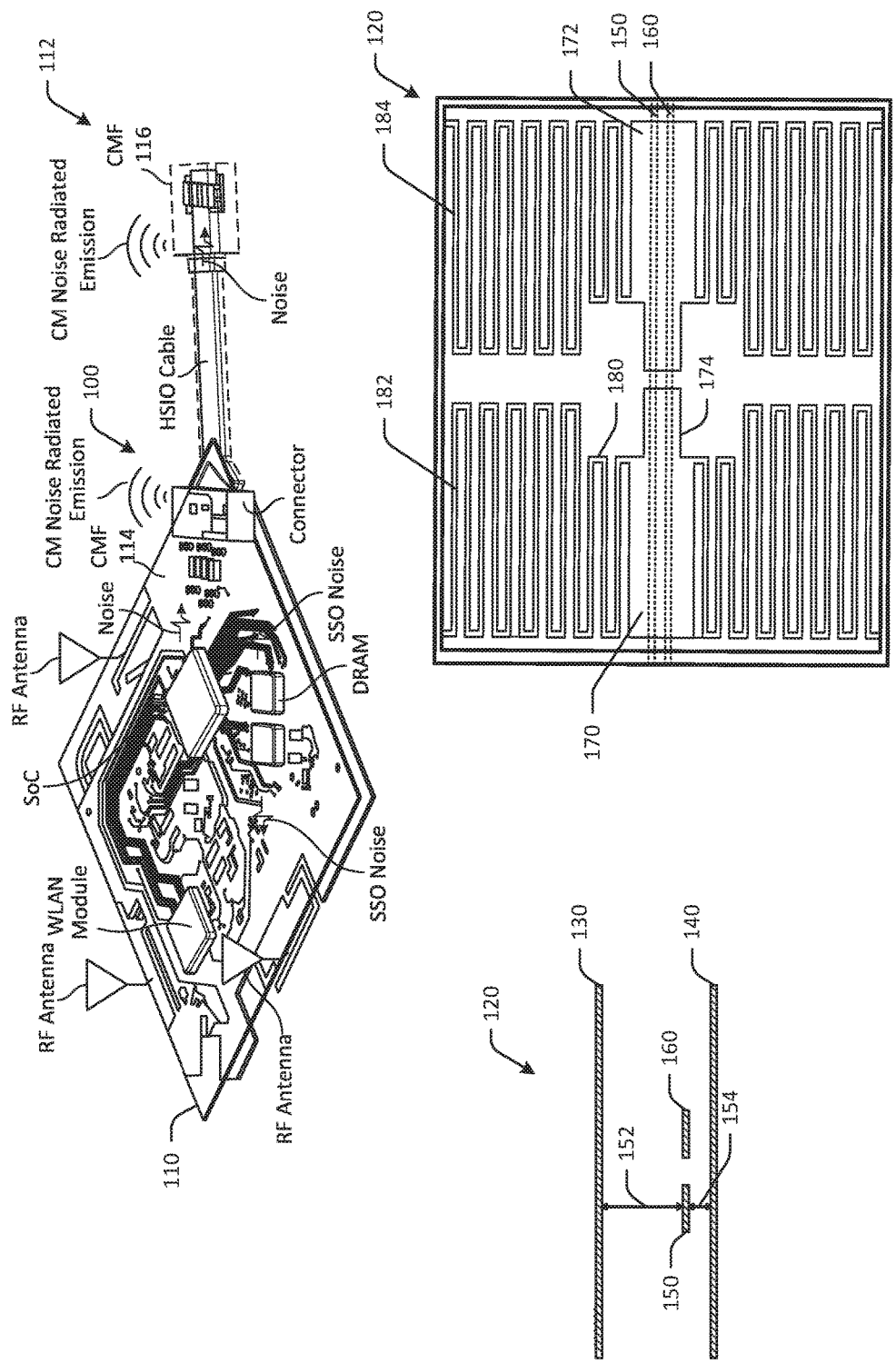
FIG. 1 is an example use case and schematic drawing of a circuit board with an external common mode filter and a common mode filter with an inverted inductive ground structure in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic devices may be used to send and/or receive data. For example, electronic devices may include a number of wireless radios, as well as, in some instances, a number of connectors for wired communications, such as USB ports, high definition multimedia interface (HDMI) ports, and the like. Such radios and connectors may transmit signals and/or emit or radiate signals that interfere with each other and/or with other components of the electronic device. Interference may reduce or degrade the quality of other signals and/or data, and may corrupt data being sent or received at the electronic device. The impact of electromagnetic interference, which may be caused by radiated emissions from device components and/or connectors, may reduce over physical distances. For example, interference from a particular radio may be stronger near the radio than at a distance away from the radio. However, as electronic devices become more compact, physical distances between components that radiate emissions or otherwise cause interference may be reduced. Moreover, the use of shields and other components to reduce interference and/or filter signals may increase manufacturing complexity, increase device size or profile, and/or increase a cost to produce certain components or the device itself.

This disclosure relates to, among other things, systems, methods, computer-readable media, techniques, and methodologies for common mode filters that can be embedded in or otherwise integrated into circuit components, such as printed circuit boards. Certain common mode filters may have inverted inductive ground structures that result in compact footprints, thereby allowing device and/or device components to maintain or reduce component and/or device size. Some embodiments may include common mode filters that are embedded in printed circuit board. Some embodiments may include planar common mode filters, common mode filters with a number of vias, common mode filters with spiral turns, and other embodiments. Common mode filters of the disclosure may reduce or remove the need for certain chokes or external filters, and can therefore reduce manufacturing complexity and/or related costs.

Embodiments of the disclosure include cost-effective and easy-to-integrate common mode filters that are configured to control radiated emission of high speed differential signals and/or prevent interference of sensitive radio receivers that operate at various frequencies, such as 2.4 GHz, 5 GHz, and the like. Embodiments of the disclosure may therefore improve data transmission and device operating ranges.

Referring to FIG. 1, an example circuit 100 of a mobile device may include a number of electronic components. The mobile device may be any suitable portable device, such as a smartphone, an e-reader, a tablet, an audio or video streaming device, an Internet of Things (IoT) device, a product ordering button or device, a home sensor, an aging in place device, an earphone, a speaker device, or another device. The electronic components may include antennae, wireless communication modules, system-on-a-chip components, memory, and/or other components. One or more of the components may be mounted to a printed circuit board 110. For example, the components may be mounted to a top surface ("top" and "bottom" as used herein are relative and may not be absolute positions) of the printed circuit board 110.

Some of the components may output noise or interfere with signals of other components, or may generally cause electromagnetic interference. For example, simultaneous switching output noise, or ground bounce, may be the result of sudden changes in current across a power/ground inductance of the circuit 100. In another example, a connector, such as an HDMI connector used to connect to an HDMI or other high speed input/output (HSIO) cable or other HDMI output, may cause common mode noise radiated emission. Such radiated emission may be relatively strong near or adjacent to the connector, and may cause interference with other components and/or signals at the circuit 100. Radiated emission may be caused by differential to common mode conversion, and may occur as a result of driver imperfections (e.g., amplitude mismatch, P/N driver bandwidths, asymmetric rise and fall times, power supply induced timing and voltage fluctuations, etc.), channel imbalances (e.g., asymmetries in ground vias and traces, impedance discontinuities, etc.), and/or receiver imperfections (e.g., P/N impedance mismatch, nonlinear terminations, etc.).

A connector positioned at a receiving end 112 of the HSIO cable may also cause common mode noise radiated emission. To reduce common mode noise and/or radiated emission, the circuit 100 may include one or more common mode filters 114 that may be chokes or filters configured to reject common mode noise. Such filters may be mounted to the top surface of the printed circuit board 110, taking up space (and possibly increasing a footprint or size of the printed circuit board 110) and increase a bill of materials cost for the circuit 100, as well as complexity of manufacturing the circuit 100. A second common mode noise filter 116 may be positioned near the receiving end 112 connector at the receiving device.

Instead of using the common mode filters disposed on the surface of the printed circuit board 110, embodiments of the disclosure may include a planar common mode filter 120 with an inverted inductive ground structure in accordance with one or more embodiments of the disclosure. The common mode filter 120 may be embedded with, or integrated into, one or more layers of a printed circuit board, such as the printed circuit board 110. As a result, external common mode filters and/or filters or chokes that use ferrite materials may be replaced.

FIG. 1 depicts an example planar common mode filter 120 that can be integrated into and/or embedded with the printed circuit board 110, thereby removing the need to include the external common mode filters and improving signal quality while reducing a footprint or overall size of the printed circuit board 110 or device. The planar common mode filter 120 may have an inverted inductive ground reference configured to reject common mode noise propagation and/or radiated emission, and may be configured to transmit differential mode signals.

In the example of FIG. 1, the planar common mode filter 120 may be positioned at an inner layer or a middle layer of the printed circuit board. For example, a circuit board may have a first layer 130 and a second layer 140. The first layer 130 and the second layer 140 may be internal layers (e.g., middle layers between a top layer and a bottom layer, etc.), or may form one or more of a top layer or a bottom layer of the printed circuit board. In some embodiments, the first layer 130 or the second layer 140 may be a ground reference for the circuit. The planar common mode filter 120 may be disposed at the first layer 130 or the second layer 140.

The printed circuit board may include a pair of differential lines that transmit one or more signals, such as a non-return-to-zero differential signal. The pair of differential lines may include a first differential line 150 and a second differential line 160. The pair of differential lines may be traces, wires, etc., and may be formed of copper in some embodiments.

The pair of differential lines may be patterned on a surface of one or more layers of the printed circuit board or other integrated circuit component, and may be configured as strip line traces in some embodiments. The first differential line 150 may transmit a first information signal at a first voltage, and the second differential line 160 may transmit a second information signal at a second voltage that complements the first information signal. In some embodiments, the second information signal may be an inverted signal, or may be equal and opposite, with respect to the first information signal. The pair of differential lines may be electrically coupled to a connector, such as an HDMI connector, and the planar common mode filter 120 may be positioned adjacent to the HDMI connector.

The pair of differential signals may be spaced apart, or separated, from the first layer 130 of the printed circuit board by a first distance 152, and spaced apart, or separated, from the second layer 140 by a second distance 154. In some embodiments, the second distance 154 may be less than or equal to the first distance 152.

The planar common mode filter 120 is depicted in a top view in FIG. 1. The planar common mode filter 120 may be disposed on one or more layers of a multi-layer printed circuit board. In some embodiments, one or more of the layers may be formed of an FR4 material, and the pair of differential traces or lines may be disposed on the substrate formed of an FR4 or other material substrate.

The planar common mode filter 120 may be formed of a conductive material, such as copper, and may include a capacitance or signal reference structure and an inductive ground structure. For example, the signal reference structure may include a first rectangular portion 170 having a first length and a first width, and a second rectangular portion 172 having the same first length and the first width as the first rectangular portion 170. The second rectangular portion may be separated from the first rectangular portion by a first distance. In some embodiments, each of the first rectangular portion 170 and the second rectangular portion 172 may be positioned adjacent to, or connected to, relatively smaller rectangular portions, as illustrated in FIG. 1 and discussed with respect to FIG. 2. For example, the first rectangular portion 170 may be connected to a third rectangular portion 174 that has a shorter length and smaller width than the first rectangular portion 170.

The planar common mode filter 120 may include an inductive ground structure 182 that includes a number of cells. For example, a first cell may include a first conductive line 180 coupled to a first side of the first rectangular portion and a first edge or first outer portion (e.g., an outer portion of the common mode filter may be a portion of the layer or substrate of a printed circuit board, etc.) of the common mode filter 120, and a second cell 184 having a second conductive line coupled to a first side of the second rectangular portion and the first outer portion (e.g., the same side, respectively, of both the first rectangular portion 170 and the second rectangular portion 172).

The first conductive line 180 may be a meandered trace, such as a copper trace, that has a first segment with a length substantially equal to, or equal to, the first length of the first rectangular portion 170, and a second segment having a length that is greater than the length of the first segment, as illustrated in FIG. 1. The second segment may be closer to the outer portion of the planar common mode filter 120 than the first segment.

The inductive ground structure may include one or more cells. For example, the planar common mode filter 120 may include a third cell having a third conductive line coupled to a second side of the first rectangular portion 170 that is opposite the first side, and a second outer portion of the common mode filter 120, as well as a fourth cell having a fourth conductive line coupled to a second side of the second rectangular portion and the second outer portion.

The pair of differential lines may be aligned with the signal reference structure of the common mode filter 120. For example, central axes of the pair of differential lines may be aligned with a longitudinal axis of the first rectangular portion 170 and/or the second rectangular portion 172.

The common mode filter 120 may be symmetrical about one or both of a longitudinal axis and/or a latitudinal axis. For example, a vertical line in the top view of FIG. 1 may represent a longitudinal axis or a vertical axis of the common mode filter 120, and the common mode filter 120 may be symmetrical about the longitudinal axis. Similarly, a horizontal line may represent a latitudinal axis or horizontal axis of the common mode filter 120, and the common mode filter 120 may be symmetrical about the latitudinal axis.

The signal reference structure (e.g., rectangular portions 170, 172, 174, etc., along with the gap between the rectangular portions, etc.) in addition to the inductive structure may form a ground reference for the differential signal.

Certain values, such as spacing between portions of the meandered traces, distances from outer portions, dimensions of rectangles, and so forth may be used to tune performance and/or characteristics of the planar common mode filter 120. In particular, the configuration and dimensions of the planar common mode filter 120 may be modified to tune the values of the inverted inductive ground, differential mode capacitance, and common mode capacitance.

The planar common mode filter 120 may therefore be configured to reject common mode noise, and/or to suppress electromagnetic interference caused by common mode noise propagating along the pair of differential lines. Example common mode noise may be caused by differential signals skewed in time, unbalanced in amplitude, and so forth. The planar common mode filter 120 may therefore act as an inductor for common modes, and not for differential modes and may be configured to distinguish between noise and signals of the same frequencies.

In some embodiments, more than one planar common mode filter 120 may be coupled in a cascaded arrangement across one or more layers of a printed circuit board, so as to provide additional rejection of noise at the same and/or different frequencies or ranges of frequencies. For example, a second planar common mode filter may be disposed on the same FR4 material substrate as the planar common mode filter 120, or a different layer of the printed circuit board, and embedded in the multi-layer printed circuit board. The second planar common mode filter may be configured to suppress a second range of common mode noise frequencies.

As a result, embodiments of the disclosure may mitigate common mode noise and its subsequent impact on sensitive antennas without the need for discrete chokes or filters, thereby resulting in reduced costs, reduced complexity, and reduced sizes of circuitry, without disrupting differential signal transmission properties. High speed differential signals that utilize certain protocols (e.g., HDMI, PCIe, SATA, USB, MIPI, etc.) and radio receivers may therefore coexist regardless of the higher data transmission and relatively dense level of system integration in electronic devices.

Example embodiments of the disclosure provide a number of technical features or technical effects. For example, in accordance with example embodiments of the disclosure, certain embodiments of the disclosure may include common mode filters with inverted inductive ground structures that reduce circuit size and, in some instances, improve rejection of common mode noise. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
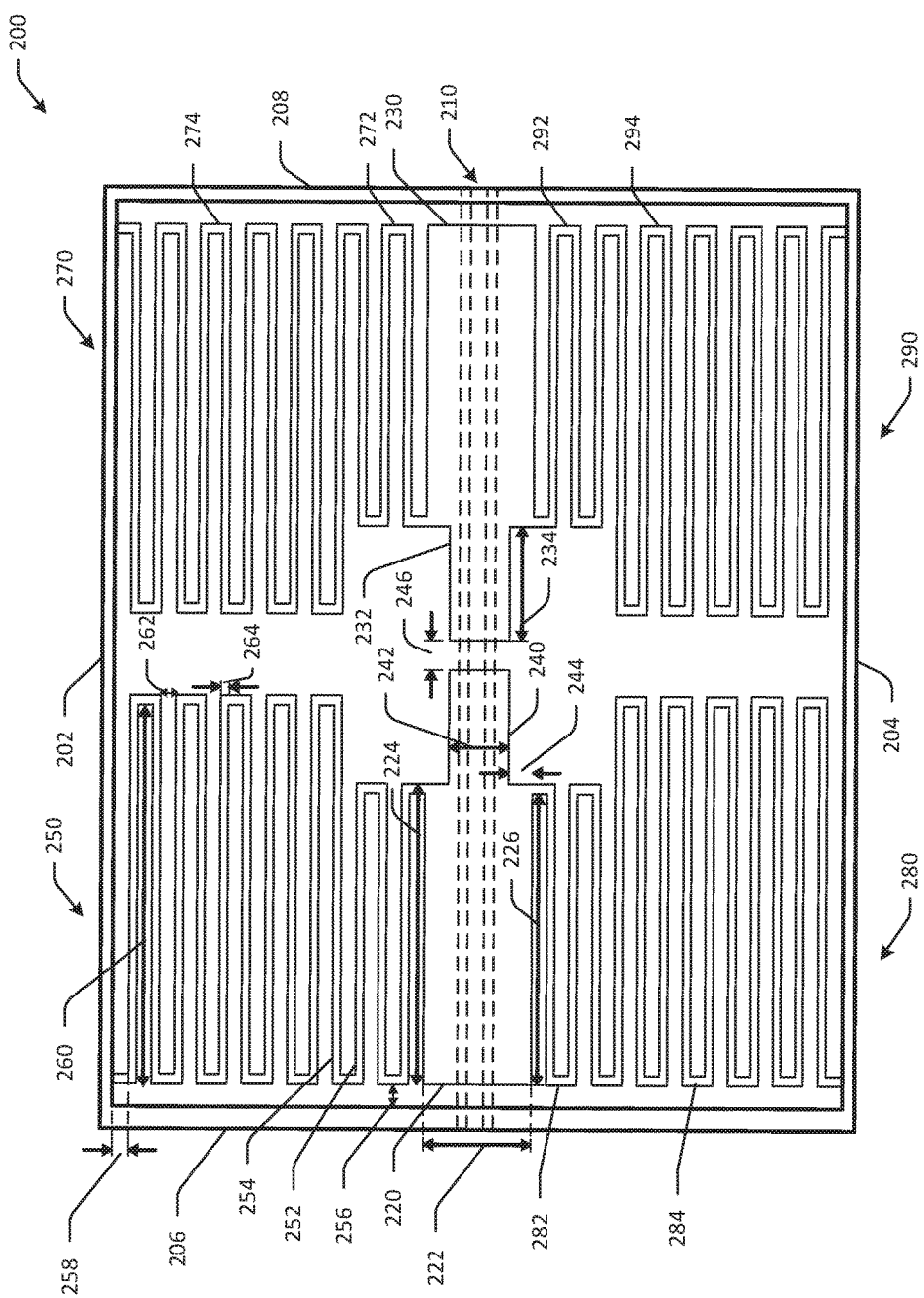
FIG. 2 is a schematic drawing of an example common mode filter with an inverted inductive ground structure in top view in accordance with one or more embodiments of the disclosure.

FIG. 2 depicts an example common mode filter 200 with an inverted inductive ground structure in top view in accordance with one or more embodiments of the disclosure. The common mode filter 200 may be the planar common mode filter 120 of FIG. 1.

The common mode filter 200 may be configured to cancel or suppress common mode noise. In some embodiments, the common mode filter 200 may be configured to reject noise of a certain frequency, or noise within a certain band or range of frequencies. The common mode filter 200 may be disposed on a substrate that forms a layer or a partial layer of a printed circuit board or other circuit component. The common mode filter 200 may be embedded in the printed circuit board and may be formed of a conductive material, such as copper. In some embodiments, the common mode filter 200 may be patterned on a substrate The common mode filter 200 may have one or more outer portions that form an outer perimeter of the common mode filter 200. For example, the common mode filter 200 may have a first outer portion 202, a second outer portion 204 opposite the first outer portion 202, a third outer portion 206, and a fourth outer portion 208 opposite the third outer portion 206.

A pair of differential traces 210 may be positioned on a layer of the printed circuit board adjacent to the common mode filter 200. The pair of differential traces may be differential lines configured to transmit equal and opposite signals. In some embodiments, the pair of differential traces 210 may be disposed between a bottom layer of the printed circuit board and the common mode filter 200, while in other embodiments, the pair of differential traces 210 may be disposed between a top layer of the printed circuit board and the common mode filter 200. A central axis of the pair of differential transmission lines 210 may be aligned with a longitudinal axis of the first rectangular portion 220. The common mode filter 200 may be symmetrical about one or both a longitudinal axis and a latitudinal axis.

The common mode filter 200 may include a first capacitance component or first signal reference component. The first signal reference component may include a first rectangular copper portion 220 having a first width 222 and a first length 224, and a second rectangular copper portion 240 having a second width 242 that is less than the first width 222 and a second length 234 that is less than the first length 224 (the second rectangular copper portion 240 may have the same dimensions as a corresponding copper portion and may therefore have the second length 234). The first rectangular copper portion 220 may be positioned adjacent to and/or coupled to the second rectangular copper portion 240.

An edge of the second rectangular copper portion 240 may be offset from an edge of the first rectangular copper portion 220 by a first offset distance 244 (e.g., twice the first offset distance 244 may be equal to a difference between the first width 222 and the second width 242, etc.).

The common mode filter 200 may include an inverted inductive ground structure. For example, the common mode filter 200 may include a first conductive line or a first meandering copper trace 250 coupled to a first side of the first rectangular copper portion 220. A meandering trace may be a trace that changes direction on the printed circuit board layer and has a predetermined length. Meandering traces may meander in various directions, patterns, and/or geometries, such as a snake-like pattern, a spiral pattern, a rectangular pattern, and other geometries or patterns. In some embodiments, the first meandering copper trace 250 may be any suitable conductive line. The first meandering copper trace 250 may be formed of segments having a width 264. The first meandering copper trace 250 may extend from the first side of the first rectangular copper portion 220 to the first outer portion 202 of the common mode filter 200. The first meandering copper trace 250 may include a first segment 252 and a second segment 254. The first segment 252 and the second segment 254 may be parallel. In some embodiments, the first segment 252 may be connected to the second segment 254 with one or more connecting portions that may be transverse or perpendicular to one or both the first segment 252 or the second segment 254. For example, in FIG. 2, the first meandering copper trace 250 of the common mode filter 200 may include a portion that has segments of a first length 226 (which may be equal to or less than the first length 224 of the first rectangular copper portion 220), and another portion that has segments of a second or segment length 260 that is greater than the first length 226 and/or the first length 224. The portion with segments of the first length 226 may be disposed closer to the first rectangular portion 220 than the first outer portion 202, and the portion with segments of the second length 260 may be disposed closer to the first outer portion 202 than the first rectangular portion 220. The first meandering copper trace 250 may be separated from the third outer portion 206 by a third distance or edge gap 256. The first meandering copper trace 250 may be coupled to the first outer portion 202, and a segment of the first meandering copper trace 250 may be separated from the first outer portion 202 by a fourth distance or edge gap 258. The first meandering copper trace 250 may form at least part of a first cell of the common mode filter 200.

In the example of FIG. 2, the first meandering copper trace 250 includes the first segment 252 having the first length 226, a second segment perpendicular to the first segment 226, and the third segment 254 parallel to the first segment 252, the third segment 254 having the segment length 260 that is greater than the first length 226.

The respective portions may be coupled with one or more connecting lines. The connecting lines may form a segment separation distance 262 between adjacent segments of the first meandering copper trace 250. For example, the greater the length of a connecting line, the greater the distance or spacing between adjacent segments of the first meandering copper trace 250. In some embodiments, connecting portions may have uniform lengths, while in other embodiments, connecting portions may have different lengths.

The common mode filter 200 may include a second conductive line or a second meandering copper trace 280 coupled to a second side of the first rectangular copper portion 220. The second side may be opposite the first side. The second meandering copper trace 280 may extend from the second side to the second outer portion 204 of the common mode filter 200. The second meandering copper trace 280 may include a first portion 282 of segments having a first length and a second portion 284 of segments having a second length that is greater than the first length. The lengths of the segments of the second meandering copper trace 280 may be the same as the corresponding segments of the first meandering copper trace 250. The second meandering copper trace 280 may form at least part of a second cell of the common mode filter 200.

The common mode filter 200 may include a second signal reference component spaced apart from the first signal reference component. The second signal reference component may include a third rectangular copper portion 230 that has the first width 222 and the first length 224, and may have the same dimensions as the first rectangular copper portion 220. The second signal reference component may include a fourth rectangular copper portion 232 that may be coupled to or positioned adjacent to the third rectangular copper portion 230. The fourth rectangular copper portion 232 may have the second width 242 and the second length 234. The second signal reference component may be a mirror image of the first signal reference component relative to a longitudinal axis of the common mode filter 200.

The first signal reference component and the second signal reference component may be separated by a distance or a gap 246. More specifically, in FIG. 2, the second rectangular copper component 240 may be separated from the fourth rectangular copper component 232 by the gap 246. The gap 246 may be increased or decreased to modify coupling between the signal reference component(s) of the common mode filter 200.

A third conductive line or a third meandering copper trace 270 may form part of the inverted inductive ground structure and may be coupled to a first side of the third rectangular copper portion 230 (the first side of the third rectangular copper portion 230 being the same side as the first side of the first rectangular copper portion 220). The third meandering copper trace 270 may extend from the first side to the first outer portion 202 of the common mode filter 200. The third meandering copper trace 270 may include a first portion 272 with segments having a first length, and a second portion 274 with segments having a second length that is greater than the first length. The third meandering copper trace 270 may form at least part of a third cell of the common mode filter 200.

A fourth conductive line or a fourth meandering copper trace 290 may form part of the inverted inductive ground structure and may be coupled to a second side of the third rectangular copper portion 230, and may extend from the second side to the second outer portion 204 of the common mode filter 200. The fourth meandering copper trace 290 may include a first portion 292 with segments having a first length, and a second portion 294 with segments having a second length that is greater than the first length. The first meandering copper trace 250, the second meandering copper trace 280, the third meandering copper trace 270, and the fourth meandering copper trace 290 may form an inverted inductive ground reference for a circuit. The fourth meandering copper trace 290 may form at least part of a fourth cell of the common mode filter 200.

To tune or modify the values of the inverted inductive ground, the width 264, the first edge gap 256, the second edge gap 258, the segment separation distance 262, and the segment length 260 may be modified. In some instances, the offset 244 may also be modified.

To tune or modify the values of the differential mode capacitance and/or the common mode capacitance, the gap 246, the length 226, the offset 244, the width 242, and the length 234 may be modified. In some instances, the width 222 may also be modified. The values of 152 and 154 in FIG. 1, as well as the thickness of the differential lines and substrate material may impact the capacitance and/or ground.

To minimize a footprint of the common mode filter 200, the segment length 260 and the width 242 may be minimized. As the segment separation distance 262 decreases and/or the segment length 260 increases, the inductance may increase.

In some embodiments, the differential pair may be separated by a distance of about 0.13 mm, the width 222 may be about 1 mm, the length 226 may be about 2.5 mm, the offset 244 may be about 0.2 mm, the width 242 may be about 0.6 mm, the length 234 may be about 1.05 mm, the segment length 260 may be about 3.6 mm, the gap 246 may be about 0.3 mm, the edge gap 256 may be about 0.2 mm, the edge gap 258 may also be about 0.2 mm, the segment separation distance 262 may also be about 0.2 mm, the distance 152 in FIG. 1 may be about 0.65 mm, the distance 154 in FIG. 1 may be about 0.26 mm, the differential pair thickness may be about 0.03 mm, the dielectric constant may be about 3.8, and the dissipation factor may be about 0.02. This configuration may result in a differential impedance of 100 ohm and a common mode impedance of 25 ohm in a conventional differential pair line without the common mode reference pattern structure.

To describe the operation of the common mode filter in an embodiment, a first-order equation relationship of the lower and upper common mode cutoff frequencies whose values are related to the below may be used:

$$\text{Upper Cutoff Frequency} = \frac{1}{2\pi\sqrt{(L_s C_{CM})}}$$

$$\text{Lower Cutoff Frequency} = \frac{1}{2\pi\sqrt{(L_s (2C_{DM} + C_{CM}))}}$$

In these formulae, $L_s$ is the lumped series inductance, $C_{CM}$ is the common mode capacitance value, and $C_{DM}$ is the total differential mode capacitance value. This relationship may provide operational insight into the behavior of the device and is simplified for heuristic purposes. In some instances, the relationship may be impacted by the coupling of the traces over the patterned ground to reject common mode noise which may contain a series of cutoff frequencies with different amplitudes of rejection and obtain a broadband response. Such values may be obtained from a 3D electromagnetic field solver to obtain the complex electric and magnetic coupling of the signal traces to the reference structure.

Figure 3:
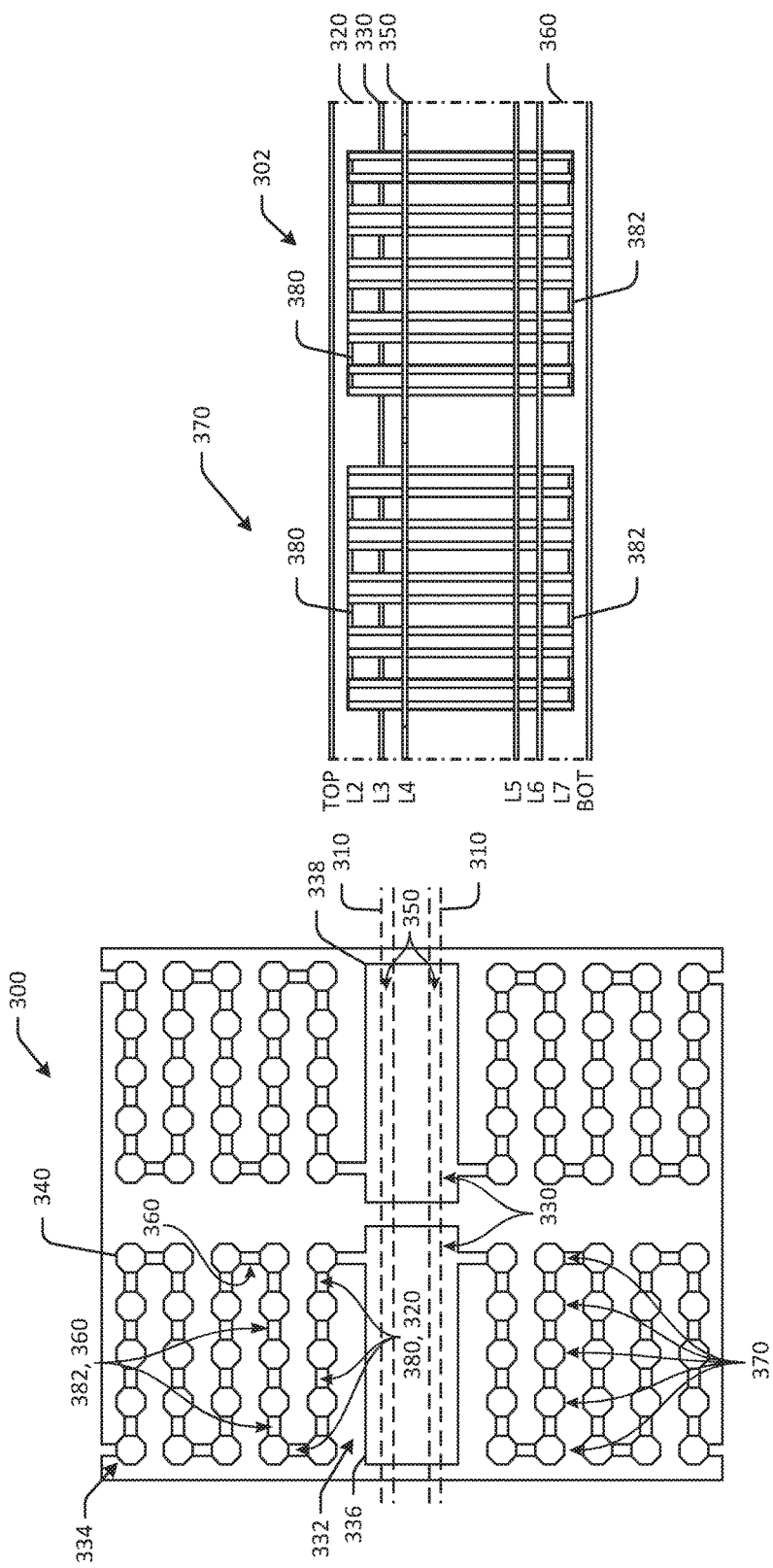
FIGS. 3-4 are schematic drawings of example common mode filters with vias in various views in accordance with one or more embodiments of the disclosure.
Figure 4:
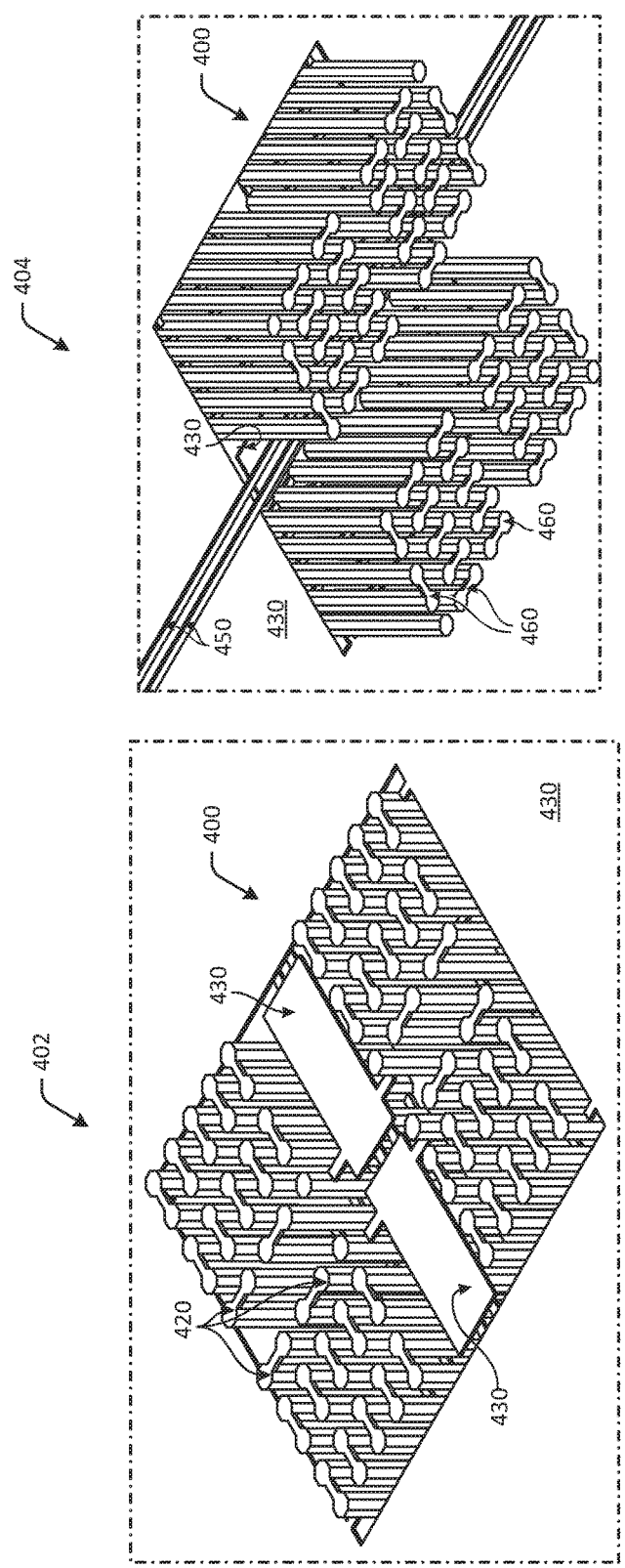

FIGS. 3-4 depicts an example common mode filter 300 with vias in various views in accordance with one or more embodiments of the disclosure. In some embodiments, one or more types of vias, such as microvias, plated through hole vias, and the like, may be used to reduce certain dimensions of a printed circuit board 302 with the common mode filter 300. For example, the common mode filter 300 may have reduced planar dimensions (e.g., in the X-Y plane, etc.) because of the use of additional layers of a printed circuit board instead of the planar meandering lines illustrated in FIG. 2. The common mode filter 300 is illustrated in top view and cross-sectional view in FIG. 3.

The common mode filter 300 may be disposed or embedded at least partially within the printed circuit board 302. For example, as illustrated in the cross-sectional view in FIG. 3, the printed circuit board 302 may include a top layer, middle layers L2, L3, L4, L5, L6, L7, and a bottom layer. The top view of the common mode filter 300 does not include the top layer. For the middle layers, L2 may be a second layer 320 since the top layer may be a first layer, L3 may be a third layer 330, L4 may be a fourth layer 350, and L7 may be a seventh layer 360.

The printed circuit board 302 may include a pair of differential transmission lines 310. The pair of differential transmission lines 310 may be positioned or disposed at the fourth layer 350 of the printed circuit board.

The common mode filter 300 may be embedded in the printed circuit board 302. The common mode filter 300 may be formed of a conductive material and may include a signal reference structure 332 and an inductive ground structure 334. The signal reference structure 332 may include a first rectangular portion 336 having a first length and a first width, and a second rectangular portion 338 having the first length and the first width. Both the first and second rectangular portions 336, 338 may have the same dimensions. The second rectangular portion 338 may be separated from the first rectangular portion 336 by a first distance. The inductive ground structure 334 may include a number of cells. Cells may be portions of the common mode filter that form a ground reference for a circuit. For example, the inductive ground structure 334 may include a first cell having a first conductive line coupled to a first side of the first rectangular portion 336 and a first outer portion of the common mode filter 300, and a second cell having a second conductive line coupled to a first side of the second rectangular portion 338 and the first outer portion of the common mode filter 300.

The signal reference structure 332 may be disposed on L3, or the third layer 330 of the printed circuit board 302. The signal reference structure 332 may be disposed on a layer adjacent to the layer on which the differential transmission lines 310 are disposed.

One or more cells of the common mode filter 300 may include a number of vias, such as plated through hole vias. Plated through hole vias may be holes formed in the printed circuit board 302 and may include a barrel (e.g., conductive tube that fills the through hole, etc.), a pad that connects the end of a barrel to a trace or other component, and/or an antipad that forms a clearance between a barrel and a disconnected metal layer. Some embodiments may include different types of vias.

For example, the first cell of the common mode filter 300 may include an array of vias that extend from the second layer 320 through the third layer 330 and through the fourth layer 350 to the seventh layer 360. In the illustrated example, the array of vias may be a 5×5 array of vias formed in the printed circuit board 302, where each of the vias in the array, such as a first via 340, extends from L2 to L7. Other configurations may be used.

Arrays of vias may include via connections that connect adjacent vias to one another. Via connections may be traces, conductive materials, or other circuit components configured to electrically couple one or more vias together. For example, the common mode filter 300 may include a first set of via connections 380 arranged in a linear configuration. The first set of via connections 380 may be disposed at the second layer 320, and may electrically couple adjacent via terminations at the second layer 320. The common mode filter 300 may include a second set of via connections 382 that may also be arranged in a linear configuration. The second set of via connections 382 may be disposed at the seventh layer 360, and may be configured to electrically couple adjacent via terminations at the seventh layer 360. The vias may therefore form a three-dimensional snake or spiral pattern across multiple layers of the printed circuit board 302. One or more transverse via connections may also be included and may electrically couple adjacent rows of vias together. The transverse via connections may alternate between the second layer 320 and the seventh layer 360, or other layers in different embodiments.

The common mode filter 300 may include one or more rows of plated through hole vias 370 that may be connected at alternating layers, such as at the second layer 320 for a first row and at the seventh layer 360 for an adjacent second row.

In FIG. 4, a common mode filter 400 with vias is illustrated in a top perspective view 402 and a bottom perspective view 404 with the top and bottom layers removed for visibility. The common mode filter 400 may be the same or different than the common mode filter 300 of FIG. 3. As illustrated in the top perspective view 402, the common mode filter 400 may include a signal reference structure 430 that is positioned at, for example, a third layer of a printed circuit board. One or more vias may extend from a layer relatively higher than the third layer, such as the second layer of the printed circuit board, to, for example, a seventh layer of the printed circuit board. Via connections 420 may connect some pairs of adjacent vias at the second layer. As illustrated in the bottom perspective view 404, via connections 460 may connect the other pairs of adjacent vias at, for example, the seventh layer of the printed circuit board. Accordingly, vias in the same row may be connected with via connections at different layers. Differential lines 450 may be positioned at a layer relatively lower than the capacitive structure 430, such as at a fourth layer of the printed circuit board.

Such configurations may be used and/or modified to reduce certain dimensions of a printed circuit board and/or common mode filter. As previously discussed, one or more common mode filters may be coupled so as to reject common mode noise of multiple frequencies.

Figure 5:
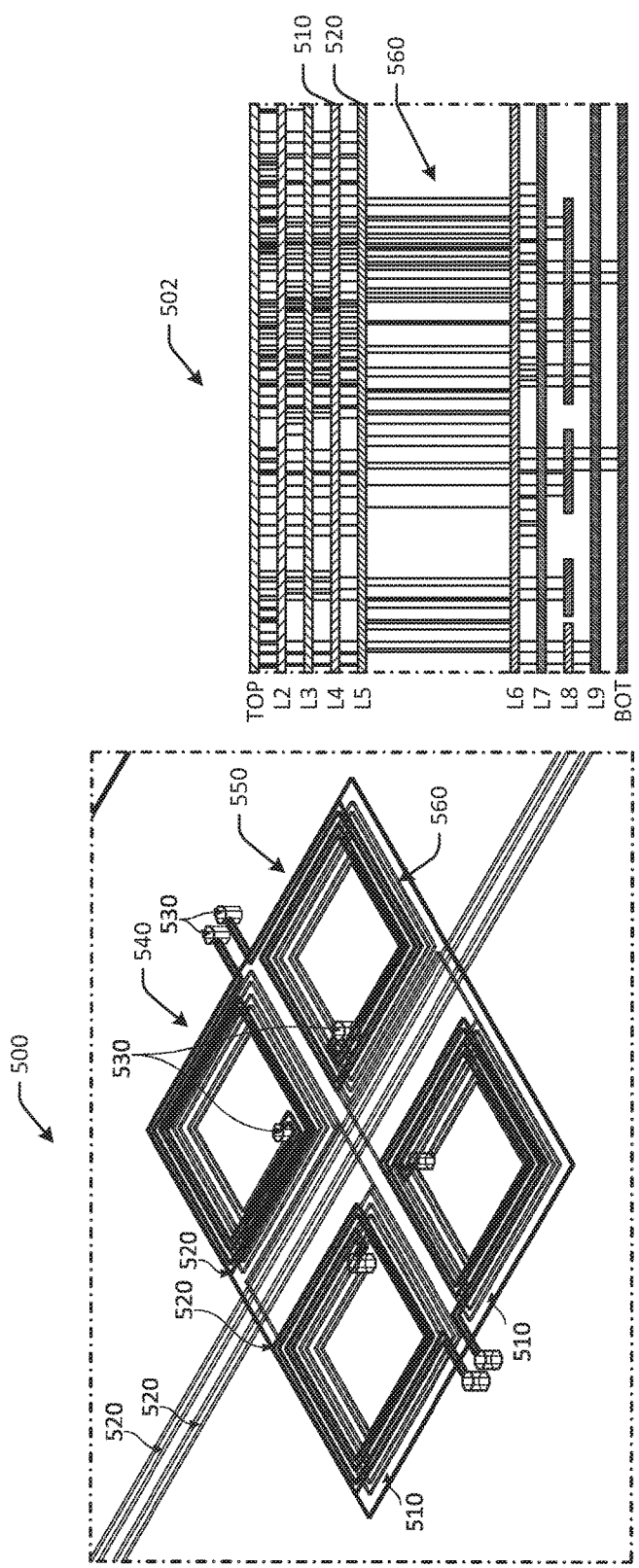
FIGS. 5-6 are schematic drawings of an example common mode filter with spiral turns in various views in accordance with one or more embodiments of the disclosure.
Figure 6:
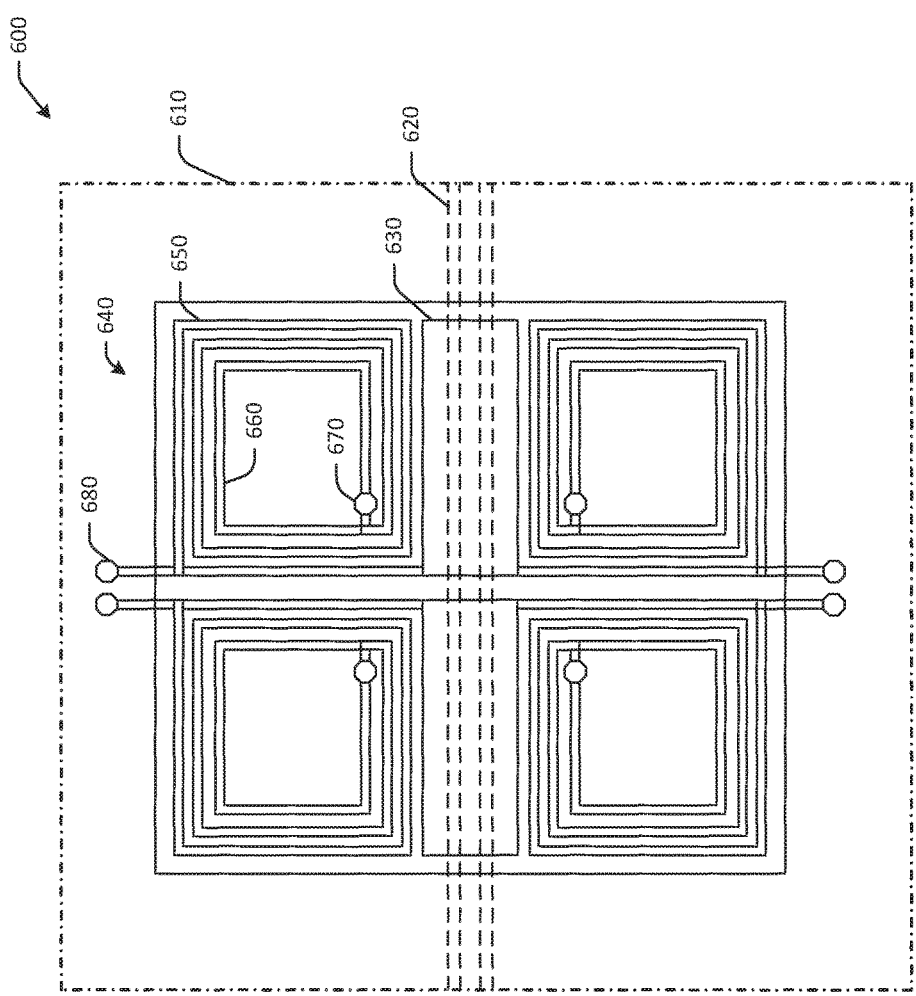

FIGS. 5-6 depict an example common mode filter 500 with spiral turns in various views in accordance with one or more embodiments of the disclosure. Some embodiments may include spiral turns that can affect one or more dimensions of a common mode filter and/or printed circuit board. For example, a printed circuit board 502 may include a number of layers, such as a top layer, middle layers L2, L3, L4, L5, L6, L7, and a bottom layer. L4 may be referred to as a fourth layer 510 and L5 may be referred to as a fifth layer 520.

A pair of differential transmission lines may be disposed at the fifth layer 520, and a signal reference structure may be disposed at the fourth layer 510. One or more spiral turn structures, such as a first spiral turn structure 540 and a second spiral turn structure 550, may be disposed about one or more layers of the printed circuit board 502. For example, the first spiral turn structure 540 and a second spiral turn structure 550 may extend from the fourth layer 510 to the fifth layer 520. In some embodiments, inverse spiral turn structures may be disposed on the fourth layer 510 and the fifth layer 520. For example, the second spiral turn structure 550 may be disposed at the fourth layer 510, and a corresponding inverse spiral turn structure 560 may be disposed at the fifth layer 520. The spiral turn structures may be connected or electrically coupled with one or more vias that connects the adjacent layers. For example, one or more microvias 530 may be disposed about the printed circuit board 502 and may extend between the fourth layer 510 and the fifth layer 520. As illustrated in the cross-sectional view in FIG. 5, one or more of the vias may extend to the L6 or L7 layers of the printed circuit board 502, and so forth. The spiral can extend on the L2, L3 and other internal layers as needed.

FIG. 6 illustrates a common mode filter 600 in top view with a top layer of a printed circuit board removed for illustration. The common mode filter 600 may be the same common mode filter 500 of FIG. 5 or may be different. In FIG. 6, the printed circuit board may include a first layer 610 at which a pair of differential transmission lines 620 are disposed, and a second layer adjacent to the first layer. The common mode filter 600 may be disposed on the second layer. The common mode filter 600 may be formed of a conductive material and may include a signal reference structure 630 and an inductive ground structure 640. The inductive ground structure 640 may include a first conductive line 650 disposed on the first layer and a second conductive line 660 disposed on the second layer. The first conductive line 650 may be arranged in a spiral turn configuration and the second conductive line 660 may be arranged in an opposite spiral turn configuration. The signal reference structure 630 may include a first rectangular portion positioned adjacent to the second conductive line 660 on the second layer. The first conductive line 650 may be magnetically coupled to the second conductive line 660. A first microvia 670 may couple the first layer to the second layer. The microvia 670 may be positioned at an internal end of a spiral formed by the first conductive line 650, as illustrated in FIG. 6. A second microvia 680 may be positioned about an outer portion of the common mode filter 600.

Figure 7:
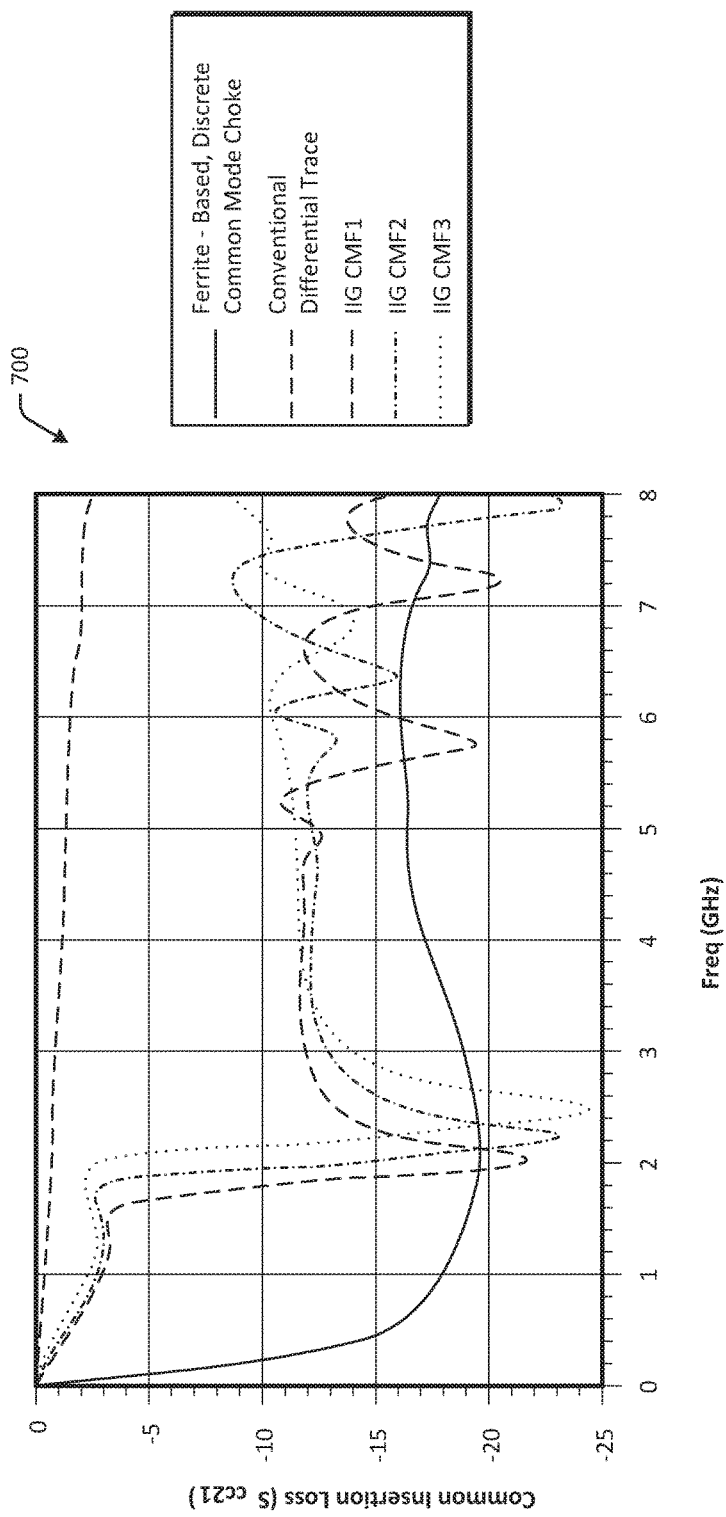
FIG. 7 is an example graph illustrating common insertion loss and frequency data for various common mode filters in accordance with one or more embodiments of the disclosure.

FIG. 7 depicts an example graph 700 illustrating common insertion loss and frequency data for various common mode filters in accordance with one or more embodiments of the disclosure. In the graph 700, frequency responses of a group of different common mode filters having inverted inductive grounds are plotted, in addition to frequency responses of a conventional differential trace and a ferrite-based, discrete common mode choke. As illustrated in the graph 700, which plots common insertion loss (Scc21) vs. frequency, common mode noise rejected by common mode filters having inverted inductive grounds performs better than the ferrite-based discrete common mode choke—a conventional differential trace pair is plotted as a reference. The common mode noise may otherwise convert to radiated emission for the desired spectrum, which in FIG. 7 is the 2.4-2.5 GHz spectrum where Bluetooth, 802.11b/g/n and other technologies dominate. In a separate differential insertion loss (Sdd21) plot, embodiments of the disclosure had loss characteristics similar to a conventional differential pair and still passed through the desired signal.

Figure 8:
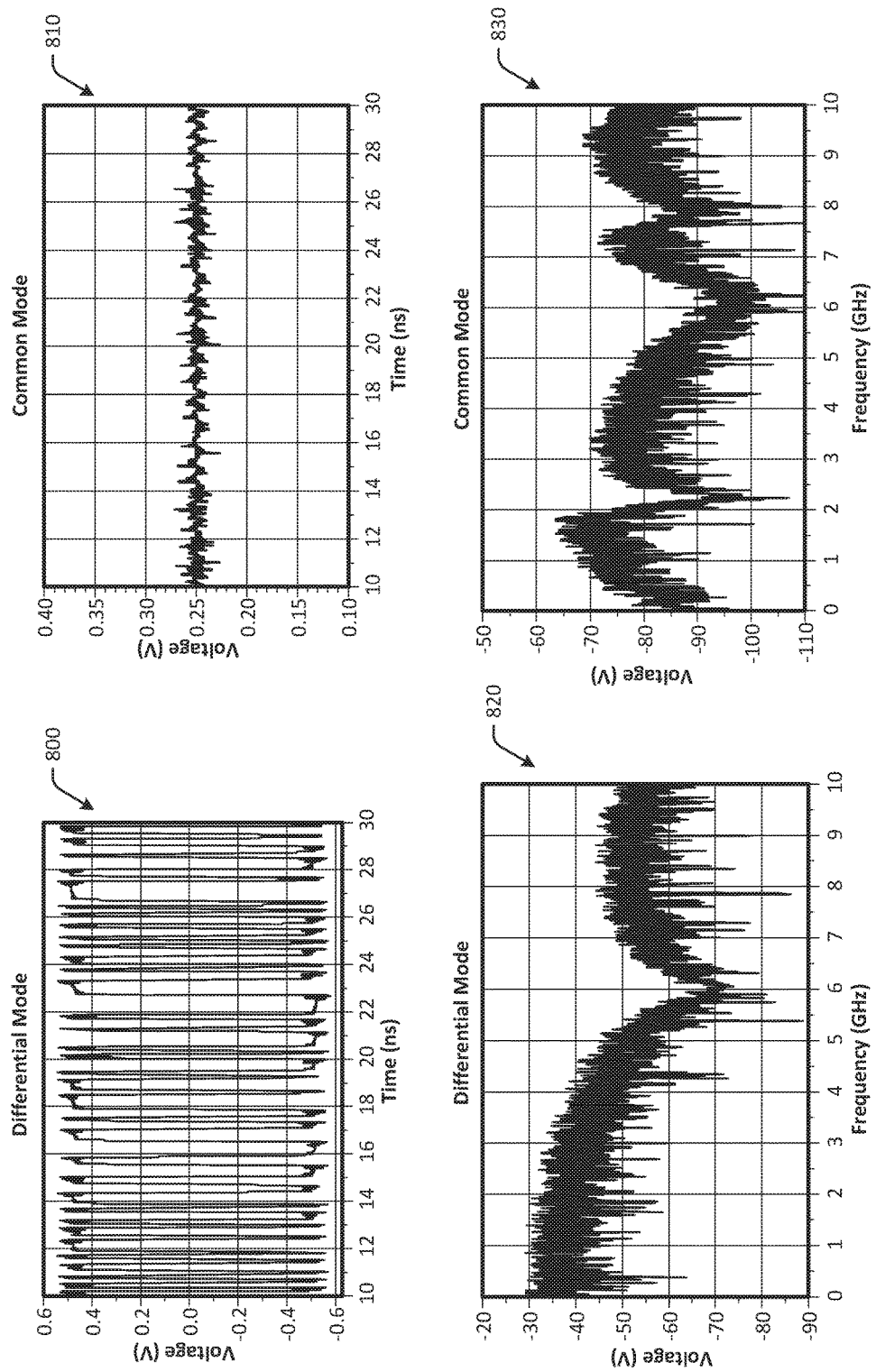
FIG. 8 depicts example graphs illustrating voltage and frequency data in differential and common modes for various common mode filters in accordance with one or more embodiments of the disclosure.

FIG. 8 depicts example graphs illustrating voltage and frequency data in differential and common modes for various common mode filters in accordance with one or more embodiments of the disclosure. FIG. 8 illustrates an example of the differential spectrum and common mode spectrum with the common mode filter and its time domain response. In FIG. 8, an HDMI or similar signal is passed with added common mode noise shown in the time and frequency domain along with the differential mode signal in the time and frequency domain. FIG. 8 plots the response of a common mode filter having an inverted inductive ground. In summary, there was approximately 19 dB of rejection of radiated emission (SpecPwrCM) for the common mode filter having an inverted inductive ground when the power is integrated over the 2.4 to 2.5 GHz spectrum, and while maintaining nearly the same differential mode signal transmission (SpecPwrDM). Such performance may be relatively better than ferrite-based common mode filters. In the differential mode, in both the time domain in graph 800 and the frequency domain in graph 820, performance is improved. Similarly, in common mode, in both the time domain in graph 810 and the frequency domain in graph 830, performance is improved. A contrast with conventional differential pairs is illustrated by the values in the following table:

|  | SpecPwrCM | SpecPwrDM | CM Vpp |
|---|---|---|---|
| Conventional Differential Pair | −41.505 | −16.103 | 200 mV |
| Common Mode Filter With Inverted Inductive Ground | −60.938 | −16.048 | 53 mV |

One or more operations of the methods, process flows, or use cases of FIGS. 1-8 may have been described above as being performed by a user device, or more specifically, by one or more program module(s), applications, or the like executing on a device. It should be appreciated, however, that any of the operations of the methods, process flows, or use cases of FIGS. 1-8 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-8 may be described in the context of the illustrative devices, it should be appreciated that such operations may be implemented in connection with numerous other device configurations.

The operations described and depicted in the illustrative methods, process flows, and use cases of FIGS. 1-8 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-8 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 9:
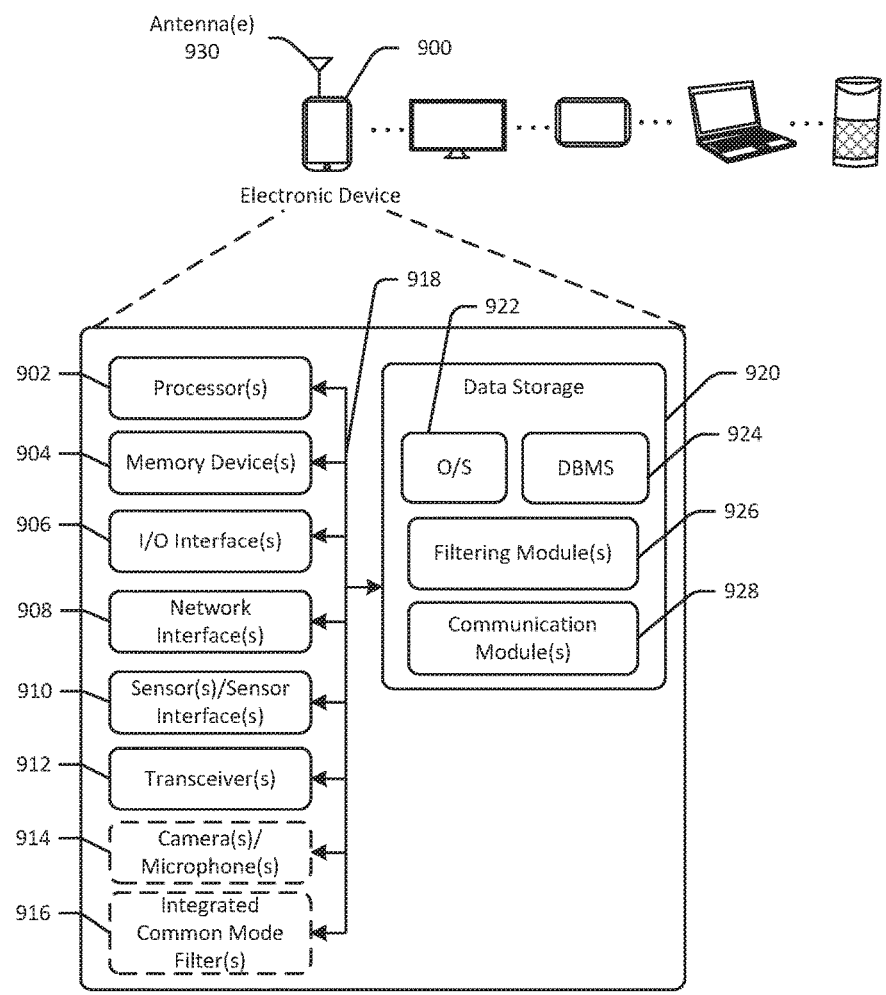
FIG. 9 schematically illustrates an example architecture of an electronic device in accordance with one or more embodiments of the disclosure.

FIG. 9 is a schematic block diagram of one or more illustrative electronic device(s) 900 in accordance with one or more example embodiments of the disclosure. The electronic device(s) 900 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; or the like. The electronic device(s) 900 may correspond to an illustrative device configuration for the device(s) of FIGS. 1-8.

The electronic device(s) 900 may be configured to communicate with one or more servers, user devices, or the like. The electronic device(s) 900 may be configured to determine voice commands, present content, determine and/or control other devices, send and/or receive data, and other operations. The electronic device(s) 900 may be configured to present content, detect sound, output digital content, and other functionality. In some embodiments, a single remote server or a single group of remote servers may be configured to perform more than one type of functionality in conjunction with an electronic device.

The electronic device(s) 900 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a micro-wave medium, a radio frequency communication medium, a satellite communication medium, or any combination thereof.

In an illustrative configuration, the electronic device(s) 900 may include one or more processors (processor(s)) 902, one or more memory devices 904 (also referred to herein as memory 904), one or more input/output (I/O) interface(s) 906, one or more network interface(s) 908, one or more sensor(s) or sensor interface(s) 910, one or more transceiver(s) 912, one or more optional camera(s) and/or microphone(s) 914, one or more optional integrated common mode filter(s) 916, and data storage 920. The electronic device(s) 900 may further include one or more bus(es) 918 that functionally couple various components of the electronic device(s) 900. The electronic device(s) 900 may further include one or more antenna(e) 934 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 918 may include at least one of a system bus, a memory bus, an address bus, or a message bus, and may permit the exchange of information (e.g., data (including computer-executable code), signaling, etc.) between various components of the electronic device(s) 900. The bus(es) 918 may include, without limitation, a memory bus or a memory controller, a peripheral bus, an accelerated graphics port, and so forth. The bus(es) 918 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 904 of the electronic device(s) 900 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 904 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 904 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 920 may include removable storage and/or non-removable storage including, but not limited to, magnetic storage, optical disk storage, and/or tape storage. The data storage 920 may provide non-volatile storage of computer-executable instructions and other data. The memory 904 and the data storage 920, removable and/or non-removable, are examples of computer-readable storage media (CRSM) as that term is used herein.

The data storage 920 may store computer-executable code, instructions, or the like that may be loadable into the memory 904 and executable by the processor(s) 902 to cause the processor(s) 902 to perform or initiate various operations. The data storage 920 may additionally store data that may be copied to the memory 904 for use by the processor(s) 902 during the execution of the computer-executable instructions. Moreover, output data generated as a result of execution of the computer-executable instructions by the processor(s) 902 may be stored initially in the memory 904, and may ultimately be copied to the data storage 920 for non-volatile storage.

More specifically, the data storage 920 may store one or more operating systems (O/S) 922; one or more database management systems (DBMS) 924; and one or more program module(s), applications, engines, computer-executable code, scripts, or the like such as, for example, one or more filtering module(s) 926, and/or one or more communication module(s) 928. Some or all of these module(s) may be sub-module(s). Any of the components depicted as being stored in the data storage 920 may include any combination of software, firmware, and/or hardware. The software and/or firmware may include computer-executable code, instructions, or the like that may be loaded into the memory 904 for execution by one or more of the processor(s) 902. Any of the components depicted as being stored in the data storage 920 may support functionality described in reference to corresponding components named earlier in this disclosure.

The data storage 920 may further store various types of data utilized by the components of the electronic device(s) 900. Any data stored in the data storage 920 may be loaded into the memory 904 for use by the processor(s) 902 in executing computer-executable code. In addition, any data depicted as being stored in the data storage 920 may potentially be stored in one or more datastore(s) and may be accessed via the DBMS 924 and loaded in the memory 904 for use by the processor(s) 902 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 902 may be configured to access the memory 904 and execute the computer-executable instructions loaded therein. For example, the processor(s) 902 may be configured to execute the computer-executable instructions of the various program module(s), applications, engines, or the like of the electronic device(s) 900 to cause or facilitate various operations to be performed in accordance with one or more embodiments of the disclosure. The processor(s) 902 may include any suitable processing unit capable of accepting data as input, processing the input data in accordance with stored computer-executable instructions, and generating output data. The processor(s) 902 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 902 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 902 may be capable of supporting any of a variety of instruction sets.

Referring now to functionality supported by the various program module(s) depicted in FIG. 9, the filtering module(s) 926 may include computer-executable instructions, code, or the like that responsive to execution by one or more of the processor(s) 902 may perform functions including, but not limited to, causing transmission of data across one or more transmission lines, and the like.

The communication module(s) 928 may include computer-executable instructions, code, or the like that responsive to execution by one or more of the processor(s) 902 may perform functions including, but not limited to, sending and/or receiving data, including content, sending and/or receiving instructions and commands, and the like.

Referring now to other illustrative components depicted as being stored in the data storage 920, the O/S 922 may be loaded from the data storage 920 into the memory 904 and may provide an interface between other application software executing on the electronic device(s) 900 and the hardware resources of the electronic device(s) 900. More specifically, the O/S 922 may include a set of computer-executable instructions for managing the hardware resources of the electronic device(s) 900 and for providing common services to other application programs (e.g., managing memory allocation among various application programs). In certain example embodiments, the O/S 922 may control execution of the other program module(s). The O/S 922 may include any operating system now known or which may be developed in the future including, but not limited to, any server operating system, any mainframe operating system, or any other proprietary or non-proprietary operating system.

The DBMS 924 may be loaded into the memory 904 and may support functionality for accessing, retrieving, storing, and/or manipulating data stored in the memory 904 and/or data stored in the data storage 920. The DBMS 924 may use any of a variety of database models (e.g., relational model, object model, etc.) and may support any of a variety of query languages. The DBMS 924 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 900 is a mobile device, the DBMS 924 may be any suitable lightweight DBMS optimized for performance on a mobile device.

Referring now to other illustrative components of the electronic device(s) 900, the input/output (I/O) interface(s) 906 may facilitate the receipt of input information by the electronic device(s) 900 from one or more I/O devices as well as the output of information from the electronic device(s) 900 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 900 or may be separate. The I/O devices may further include, for example, any number of peripheral devices such as data storage devices, printing devices, and so forth.

The I/O interface(s) 906 may also include an interface for an external peripheral device connection such as universal serial bus (USB), FireWire, Thunderbolt, Ethernet port or other connection protocol that may connect to one or more networks. The I/O interface(s) 906 may also include a connection to one or more of the antenna(e) 930 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 900 may further include one or more network interface(s) 908 via which the electronic device(s) 900 may communicate with any of a variety of other systems, platforms, networks, devices, and so forth. The network interface(s) 908 may enable communication, for example, with one or more wireless routers, one or more host servers, one or more web servers, and the like via one or more networks.

The antenna(e) 930 may include any suitable type of antenna depending, for example, on the communications protocols used to transmit or receive signals via the antenna (e) 930. Non-limiting examples of suitable antennae may include directional antennae, non-directional antennae, dipole antennae, folded dipole antennae, patch antennae, multiple-input multiple-output (MIMO) antennae, or the like. The antenna(e) 930 may be communicatively coupled to one or more transceivers 912 or radio components to which or from which signals may be transmitted or received.

As previously described, the antenna(e) 930 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 930 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 930 may be configured to transmit or receive radio frequency signals within any suitable frequency range forming part of the unlicensed portion of the radio spectrum.

The antenna(e) 930 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 912 may include any suitable radio component(s) for—in cooperation with the antenna(e) 930—transmitting or receiving radio frequency (RF) signals in the bandwidth and/or channels corresponding to the communications protocols utilized by the electronic device(s) 900 to communicate with other devices. The transceiver(s) 912 may include hardware, software, and/or firmware for modulating, transmitting, or receiving—potentially in cooperation with any of antenna(e) 930—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 912 may further include hardware, firmware, or software for receiving GNSS signals. The transceiver(s) 912 may include any known receiver and baseband suitable for communicating via the communications protocols utilized by the electronic device(s) 900. The transceiver(s) 912 may further include a low noise amplifier (LNA), additional signal amplifiers, an analog-to-digital (A/D) converter, one or more buffers, a digital baseband, or the like.

The sensor(s)/sensor interface(s) 910 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The camera(s) 914 may be any device configured to capture ambient light or images. The microphone(s) 914 may be any device configured to receive analog sound input or voice data. The integrated common mode filter(s) 916 may be any suitable printed circuit board with integrated or embedded common mode filter(s), and the like.

It should be appreciated that the program module(s), applications, computer-executable instructions, code, or the like depicted in FIG. 9 as being stored in the data storage 920 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 900, and/or hosted on other computing device(s) accessible via one or more networks, may be provided to support functionality provided by the program module(s), applications, or computer-executable code depicted in FIG. 9 and/or additional or alternate functionality. Further, functionality may be modularized differently such that processing described as being supported collectively by the collection of program module(s) depicted in FIG. 9 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 9 may be implemented, at least partially, in hardware and/or firmware across any number of devices.

It should further be appreciated that the electronic device(s) 900 may include alternate and/or additional hardware, software, or firmware components beyond those described or depicted without departing from the scope of the disclosure. More particularly, it should be appreciated that software, firmware, or hardware components depicted as forming part of the electronic device(s) 900 are merely illustrative and that some components may not be present or additional components may be provided in various embodiments. While various illustrative program module(s) have been depicted and described as software module(s) stored in the data storage 920, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-8 may be performed by a device having the illustrative configuration depicted in FIG. 9, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-8 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-8 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for That which is claimed is:

1. A device comprising:
   a multi-layer printed circuit board comprising a first layer and a second layer, the first layer comprising a first FR4 material substrate, and the second layer comprising a second FR4 material substrate;
   a pair of differential traces disposed on the first FR4 material substrate, the pair of differential traces configured to transmit equal and opposite differential signals;
   a planar common mode filter disposed on the second FR4 material substrate, the planar common mode filter configured to suppress a first range of common mode noise frequencies, wherein the planar common mode filter comprises:
      a first signal reference component comprising a first rectangular copper portion having a first width and a first length, and a second rectangular copper portion having a second width that is less than the first width and a second length that is less than the first length, the first rectangular copper portion positioned adjacent to the second rectangular copper portion;
      a first meandering copper trace coupled to a first side of the first rectangular copper portion, the first meandering copper trace extending from the first side to a first outer portion of the planar common mode filter;
      a second meandering copper trace coupled to a second side of the first rectangular copper portion, the second meandering copper trace extending from the second side to a second outer portion of the planar common mode filter;
      a second signal reference component spaced apart from the first signal reference component, the second signal reference component comprising a third rectangular copper portion having the first width and the first length, and a fourth rectangular copper portion having the second width and the second length, the fourth rectangular copper portion positioned adjacent to the third rectangular copper portion;
      a third meandering copper trace coupled to a first side of the third rectangular copper portion, the third meandering copper trace extending from the first side to the first outer portion of the planar common mode filter; and
      a fourth meandering copper trace coupled to a second side of the third rectangular copper portion, the fourth meandering copper trace extending from the second side to the second outer portion of the planar common mode filter;
      wherein the first meandering copper trace, the second meandering copper trace, the third meandering copper trace, and the fourth meandering copper trace together form an inverted inductive ground reference; and
   an HDMI connector coupled to the pair of differential traces.

2. The device of claim 1, wherein the first meandering copper trace comprises a first segment having the first length, a second segment having a second length and being perpendicular to the first segment, and a third segment having a third length and being parallel to the first segment, the third length being greater than the first length.

3. The device of claim 1, wherein the planar common mode filter is symmetrical about a vertical axis and is symmetrical about a horizontal axis.

4. The device of claim 1, wherein the multi-layer printed circuit board further comprises a top layer and a bottom layer, and wherein a first distance between the first layer and the bottom layer is less than a second distance between the first layer and the top layer.

5. A printed circuit board comprising:
   a first layer comprising a pair of differential transmission lines, wherein the first layer is a middle layer of the printed circuit board; and
   a common mode filter embedded in the printed circuit board, the common mode filter formed of a conductive material and comprising a signal reference structure and an inductive ground structure;
      wherein the signal reference structure comprises a first portion having a first length and a first width, and a second portion having the first length and the first width, the second portion separated from the first portion by a first distance; and
      wherein the inductive ground structure comprises a first conductive line coupled to a first side of the first portion and a first outer portion of the common mode filter, and a second conductive line coupled to a first side of the second portion and the first outer portion.

6. The printed circuit board of claim 5, further comprising a second layer, wherein the common mode filter is a planar common mode filter disposed on the second layer.

7. The printed circuit board of claim 5, further comprising a third portion adjacent to the first portion, the third portion having a second length that is greater than the first length, and a second width that is greater than the first width.

8. The printed circuit board of claim 7, wherein the first conductive line comprises a meandered trace comprising a first segment having the second length, and a second segment having a third length that is greater than the second length.

9. The printed circuit board of claim 5, wherein the inductive ground structure further comprises a third conductive line coupled to a second side of the first portion and a second outer portion of the common mode filter, and a fourth conductive line coupled to a second side of the second portion and the second outer portion.

10. The printed circuit board of claim 5, further comprising:
    a second layer coupled to a first side of the first layer, wherein the signal reference structure is disposed on the second layer;
    a third layer coupled to the second layer;
    a fourth layer; and
    at least one via in contact with the first conductive line that extends from the third layer through the first layer and the second layer to the fourth layer.

11. The printed circuit board of claim 10, further comprising:
    a first set of via connections arranged in a linear configuration at the third layer, wherein the first set of via connections electrically couple adjacent via terminations at the third layer; and
    a second set of via connections arranged in a linear configuration at the fourth layer, wherein the second set of via connections electrically couple adjacent via terminations at the fourth layer.

12. The printed circuit board of claim 5, wherein the first portion has a rectangular geometry and the second portion has the rectangular geometry.

13. The printed circuit board of claim 5, wherein a central axis of the pair of differential transmission lines is aligned with a longitudinal axis of the first portion.

14. The printed circuit board of claim 5, wherein the common mode filter is symmetrical about a longitudinal axis, and is symmetrical about a latitudinal axis.

15. The printed circuit board of claim 5, wherein the first conductive line has a second length, and the second conductive line has the second length.

16. The printed circuit board of claim 5, wherein the common mode filter is a first common mode filter configured to reject common mode noise of a first range of frequencies, the printed circuit board further comprising a second common mode filter coupled to the first common mode filter in series, the second common mode filter configured to reject common mode noise of a second range of frequencies.

17. A printed circuit board comprising:
a first layer comprising a pair of differential transmission lines;
a second layer adjacent to the first layer;
a microvia coupling the first layer to the second layer; and
a common mode filter disposed on the second layer, the common mode filter formed of a conductive material and comprising a signal reference structure and an inductive ground structure;
wherein the inductive ground structure comprises a first conductive line disposed on the first layer and a second conductive line disposed on the second layer; and
wherein the first conductive line is arranged in a spiral turn configuration and the second conductive line is arranged in an opposite spiral turn configuration.

18. The printed circuit board of claim 17, wherein the microvia is positioned at an internal end of a spiral formed by the first conductive line.

19. The printed circuit board of claim 17, wherein the signal reference structure comprises a first rectangular portion positioned adjacent to the second conductive line.

20. The printed circuit board of claim 17, wherein the first conductive line is magnetically coupled to the second conductive line.

* * * * *